(12) United States Patent
Carvajal et al.

(10) Patent No.: US 6,628,150 B1
(45) Date of Patent: Sep. 30, 2003

(54) SYSTEM AND METHOD TO SPEED-UP OPERATION OF A DRIVER

(75) Inventors: Fernando D. Carvajal, Fairview, TX (US); Mark W. Morgan, Allen, TX (US); Srikanth Gondi, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 10/114,516

(22) Filed: Apr. 2, 2002

(51) Int. Cl.[7] .......................... H03K 3/00; H03K 17/04
(52) U.S. Cl. ..................... 327/108; 327/65; 327/374
(58) Field of Search ............................ 327/374, 376, 327/377, 108, 112, 52–57, 63–67, 77, 87, 89, 560–563, 170; 330/253

(56) References Cited

U.S. PATENT DOCUMENTS

| | | | | |
|---|---|---|---|---|
| 4,198,578 A | * | 4/1980 | Ozawa et al. | 327/374 |
| 5,258,667 A | * | 11/1993 | Ohtake et al. | 327/374 |
| 5,338,980 A | * | 8/1994 | Ovens | 327/374 |
| 5,338,987 A | | 8/1994 | Tomasetti et al. | 307/570 |
| 5,537,070 A | * | 7/1996 | Risinger | 327/170 |
| 5,587,679 A | * | 12/1996 | Imamura | 327/170 |
| 5,825,217 A | * | 10/1998 | Lehavot | 327/112 |
| 5,959,492 A | | 9/1999 | Khoury et al. | 327/374 |
| 6,130,569 A | * | 10/2000 | Aswell et al. | 327/374 |

* cited by examiner

Primary Examiner—Toan Tran
(74) Attorney, Agent, or Firm—W. Daniel Swayze, Jr.; W. James Brady; Frederick J. Telecky, Jr.

(57) ABSTRACT

Transitions (e.g. high to low and/or low to high) associated with operation of the driver are employed to implement control, which can be applied as a pulse in response to an occurrence of the transition. The control operates to speed up the transition at the output of the driver, such as can reduce driver switching times and enable a corresponding increase in data transmission rates.

22 Claims, 7 Drawing Sheets

SYSTEM AND METHOD TO SPEED-UP OPERATION OF A DRIVER

FIELD OF THE INVENTION

The present invention relates generally to data communication transmitters and, more specifically, to systems and methods to speed-up operation of a driver, such as a differential driver.

BACKGROUND OF THE INVENTION

In a typical communication system, inter-chip high-speed communication is generally limited by the performance of driver and receiver circuits at the interface of communicating chips. Inherent driver circuit limitations often limit data rates that can be effectively implemented in accordance with any given design standard. High-speed chip-to-chip signaling often provides a bottleneck in the design of various types of systems, such as motherboards, optical transmission links, intelligent network hubs, routers and other systems.

Driver designs are challenged to meet the demands of ever increasing data rate requirements. Consequently, circuit designers continually search for ways to improve the rise times and fall times of drivers, such that driver switching speeds can be pushed higher and higher.

Standards have been established for high-speed signal handling applications including, for example, low voltage differential signaling (LVDS) and positive emitter-coupled logic (PECL). These standards enable the design of high-speed systems with minimum power dissipation and low electromagnetic interference (EMI). However, inter-chip high-speed communication is still limited by the performance of driver and receiver circuits at the interface of these circuits.

SUMMARY OF THE INVENTION

The following presents a simplified summary of the invention in order to provide a basic understanding of some aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

The present invention generally provides systems and methods to facilitate or speed up transitions associated with signals at one or more outputs of a driver. Transitions (e.g. high to low and/or low to high) associated with an output of the driver are employed to implement control, which can be applied as a pulse in response to a transition. The control operates to speed up the transition at the output of the driver, such as can reduce driver switching times of the driver and enable a corresponding increase in data transmission rates.

For example, the transitions can correspond to voltage transitions (e.g. high to low and/or low to high) associated with operation of the driver. The transitions can be detected at the output node (or nodes) or at other locations internal to the driver. The pulse can implement desired current control based on a transition, which is applied to speed up a transition at the output of the driver.

In a particular aspect of the present invention, one or more coupling devices, such as capacitors, can be employed to store a charge. For example, the capacitor(s) is operatively connected to an output of the driver to provide positive feedback (e.g., feedforward control) based on the occurrence of a transition at the output. The capacitor thus can couple a pulse during a transition that operates to improve switching speeds in the output stage of the driver.

Another aspect of the present invention provides a method to facilitate a transition at the output stage of a differential driver circuit. The method includes monitoring and detecting a transition of a signal associated with the output of the driver circuit. Based on the detection of the transition, the method further includes providing a short supplemental pulse to improve the switching speed at the output stage of the driver.

The following description and the annexed drawings set forth in detail certain illustrative aspects of the invention. These aspects are indicative, however, of but a few of the various ways in which the principles of the invention may be employed and the present invention is intended to include all such aspects and their equivalents. Other advantages and novel features of the invention will become apparent from the following detailed description of the invention when considered in conjunction with the drawings.

DETAILED DESCRIPTION OF THE INVENTION

Figure 1:
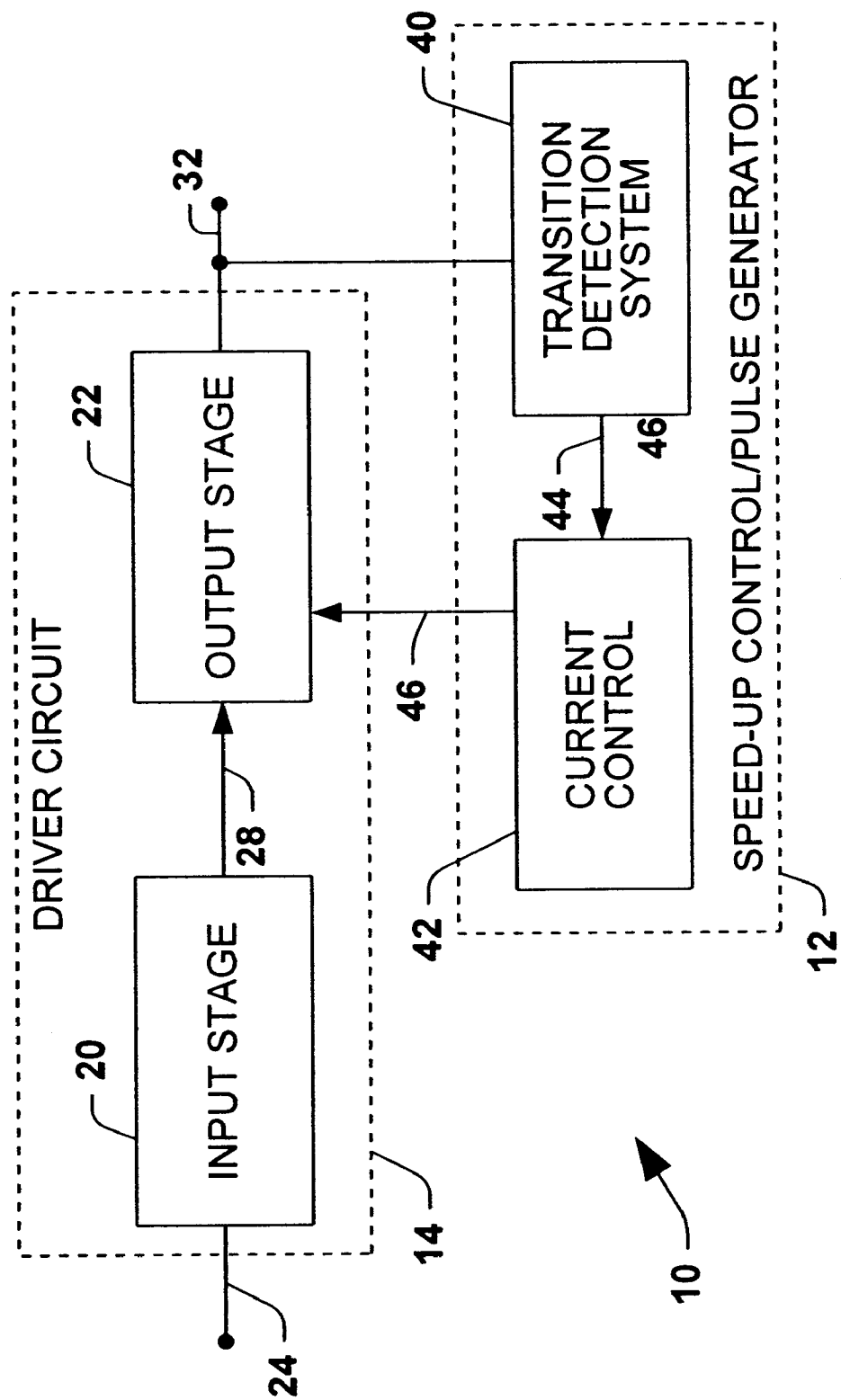
FIG. 1 illustrates a functional block diagram of a driver circuit according to an aspect of the invention.

FIG. 1 is a block diagram of a driver system 10 operative to facilitate output transitions at an output of the driver in accordance with an aspect of the present invention. The driver system 10 includes a control system 12 operatively associated with a driver circuit 14. More particularly, the system 12 is coupled to monitor one or more signals of the driver circuit 14, such as at an output or an internal portion of the driver. The control system 12 detects transitions associated with operation of the driver circuit 14 based on the monitored signal (or signals). In response to detecting such a transition, the control system 10 can operate as a pulse generator that provides a transient power pulse to implement current control relative to the driver 12 so as to expedite transitions at the driver. For example, a pulse can be generated in response to a transition, which pulse modifies current in driver to speed up the transition. By speeding up the transition, communications rates in systems employing a driver can be improved in accordance with an aspect of the present invention.

The driver circuit 14 includes an input stage 20 that is coupled to an output stage 22. The input stage 20, for example, receives an input signal provided at an input 24. Alternatively, the input signal can be a differential signal provided to a pair of inputs. The input stage 20 provides one or more intermediate signals 28 to the output stage 22. The intermediate signal 28, for example, controls associated switching circuitry of the output stage 22 based on the input signal provided at 28 to provide a corresponding output signal at 32. The output 32 can provide a single or differential output signal.

Those skilled in the art will understand and appreciate various types of driver circuitry that can be implemented in combination with a control system 12 in accordance with an aspect of the present invention. That is, the control system 12 is not restricted to any type or configuration of driver circuit, as such a control system can be employed in conjunction with almost any driver circuit as a means to speed up the rise and/or fall times during transitions at the output 32 of the driver 10.

The control circuit 12 includes a transition detection system 40 and a supplemental current control block 42. The transition detection system 40 monitors the driver circuit 14 for transitions. In the example illustrated in FIG. 1, the transition detection system 40 is configured to monitor output 32 of the output stage 22 of the driver circuit 14. It is to be understood, however, that transition detection system 40 can be configured to monitor transitions at other locations (e.g., internal nodes) of the driver circuit 14 in accordance with an aspect of the present invention. For example, the transition detection system 40 can be configured to monitor the intermediate signal 28 of the output stage 22 or other nodes internal to the output stage or input stage 20.

The transition detection system 40 provides one or more output signals 44 to the supplemental current control block 42 of the control system 12 based on the signals being monitored by the detection system. The signal 44, for example, indicates the onset of a transition in the level of one or both monitored signals. The current control block 42 is configured to implement current control relative to the output stage 22 so as to facilitate the occurrence of the transition.

In one aspect of the present invention, the current control system 42 can provide a control signal 46 to the output stage, such that the rise times and fall times of the transition at output 32 will be reduced. For example, the control system 12 provides signal 46 (or otherwise causes circuitry) to pulse supplemental current to transition switching devices (e.g., transistors) in the output stage 22 between on and off conditions more quickly. Alternatively, voltage could be pulsed to expedite the output stage 22 to change output states. The speed-up control 12 thereby speeds up the transition times of driver 10 (e.g., from high to low or low to high) in accordance with an aspect of the present invention.

Figure 2:
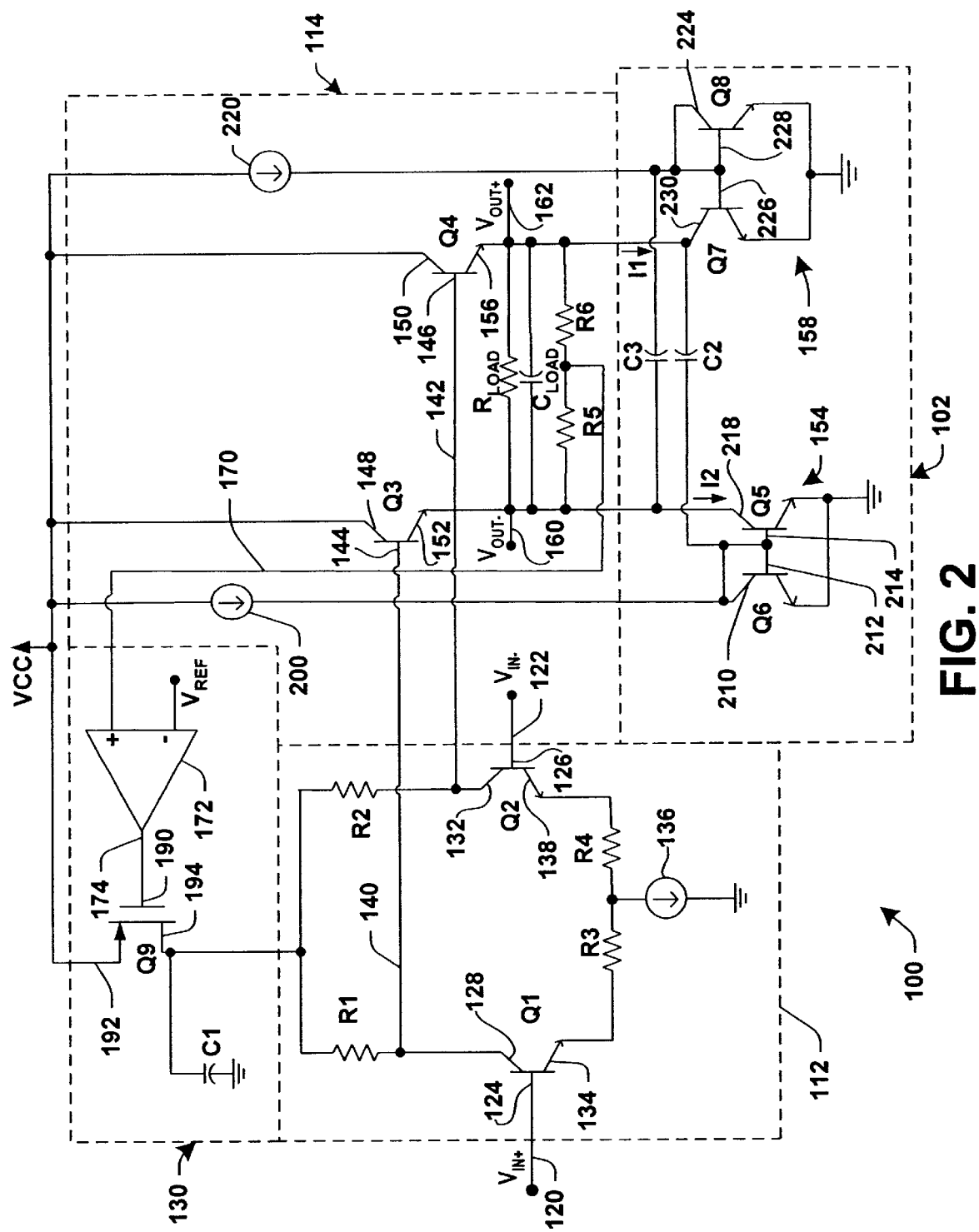
FIG. 2 illustrates an example of a driver circuit implemented in accordance with an aspect of the present invention.

FIG. 2 is an electrical schematic diagram of a communication switching apparatus 100 that includes speed up mode control circuitry 102 in accordance with an aspect of the present invention. More particularly, the switching apparatus is depicted as a driver circuit that includes an input stage (e.g., a switching circuit) 112, an output stage (e.g., a follower circuit) 114 and control circuitry 102. Control circuitry 102 operates to adjust current in output stage so as to speed up transitions at one or more of its outputs.

Switching circuit 112 includes input nodes 120 and 122 for receiving respective input signals $V_{IN+}$ and $V_{IN-}$. For example, the driver apparatus 100 is a low voltage differential switching system that receives a differential signal at inputs 120 and 122, in which the positive component of the input signal corresponds to $V_{IN+}$ and the negative component corresponds to $V_{IN-}$. Input nodes 120 and 122 are coupled with bases 124 and 126 of respective switching transistors Q1 and Q2. The collector 128 of switching transistor Q1 is coupled with a resistor R1 in series with a common mode control circuit 130. Collector 132 of switching transistor Q2 is coupled with a resistor R2 in series with control circuit 130. Emitter 134 of switching transistor Q1 is coupled with a resistor R3 in series with a current source 136 and ground. Emitter 138 of switching transistor Q2 is also coupled with a resistor R4 in series with current source 136 and ground. Resistors R3 and R4 limit current spikes, such as tend to occur when switching transistors Q1 and Q2 switch between on and off conditions.

Input stage 112 is coupled to the output stage 114 via lines 140 and 142. In particular, the lines 140 and 142 are coupled between collectors 128 and 132 of Q1 and Q2 and respective bases 144 and 146 of follower transistors Q3 and Q4 of the output stage 114. The lines 140 and 142 convey indicator signals indicating whether a respective switching transistor Q1 and Q2 is on or off. Collectors 148 and 150 of follower transistors Q3 and Q4 are coupled for receiving supply voltage $V_{CC}$. Emitter 152 of follower transistor Q3 is coupled with ground through a variable current source system 154 for supplying current I2. Similarly, emitter 156 of follower transistor Q4 is coupled with ground through a variable current source 158 for supplying current I1. Current sources 154 and 158 can independently aid speed of operation (e.g., switching speed) of follower transistors Q3 and Q4 with expected values of $R_{LOAD}$ in accordance with an aspect of the present invention.

The output stage 114 is connected to an external load represented as resistor $R_{LOAD}$ and a capacitor $C_{LOAD}$ coupled in parallel across emitters 152 and 156 of follower transistors Q3 and Q4. Output nodes 160 and 162 are also coupled at emitter nodes, such as across load resistor $R_{LOAD}$, for providing respective output signals $V_{OUT-}$ and $V_{OUT+}$. The output signals $V_{OUT-}$ and $V_{OUT+}$, for example, correspond to a differential output signal associated with the differential input signal provided at 120 and 122. Follower transistors Q3 and Q4 are controlled by the indicator signals provided via lines 140 and 142. Further, because signals appearing on lines 140 and 142 represent whether switching transistors Q1 and Q2 are on or off, follower transistors Q3 and Q4, in turn, follow operation of the associated switching transistors of the input stage.

The common mode control circuit 130 controls the common mode voltage at the output of apparatus 100. Control circuit 130 includes resistors R5 and R6 coupled in series across emitters 152 and 156 of respective transistors Q3 and Q4. A feedback line 170 is coupled with a juncture between resistors R5 and R6, which juncture corresponds to a common mode voltage of the output stage 114 (e.g., R5 and R6 are matched). Feedback line 170 is coupled with an amplifier 172 in control circuit 130 to supply a signal indicative of the common mode voltage. Amplifier 172 also receives a reference voltage $V_{REF}$. Amplifier 172 presents an amplified error signal at an output 174 representing the difference between the signal appearing on feedback line 170 and reference voltage $V_{REF}$ corresponding to a desired common mode voltage. Line 174 is coupled with gate 190 of transistor Q9. Source 192 of transistor Q9 is coupled to receive supply voltage $V_{CC}$. Drain 194 of transistor Q9 is coupled to ground through a bypass capacitor C1. Drain 194 of transistor Q9 is also coupled with resistors R1 and R2. It will be appreciated that C1 can be selected to be large enough so that the node interconnecting the capacitor C1 and resistors R1 and R2 acts as an AC ground.

Amplified error signals on line 174 are employed to control application of supply voltage $V_{CC}$ to switching transistors Q1 and Q2. The gating action of Q1 and Q2 affects signals appearing on lines 140 and 142, which, in turn, affects operation of follower transistors Q3 and Q4. When properly selected, transistor Q9 can operate effectively as an adjustable resistor to determine common mode voltage at output nodes 160 and 162. Thus, amplified error signals on line 174 controls common mode voltage appearing at output nodes 160 and 162.

As mentioned above, the current control system 102 includes current sources 154 and 158 coupled between Q3 and Q4 and electrical ground for controlling current I1 and I2 in the output stage 114. In apparatus 100 shown in FIG. 2, current sources 154 and 158 are implemented as current mirrors. Specifically, the current source 154 includes Q5 and Q6 coupled in a current mirror configuration, with Q6 coupled to a current source 200. Additionally, current source 200 is coupled between $V_{CC}$ and current source 200 is coupled to collector 210 of transistor Q6. The bases 212 and 214 of transistor Q5 are coupled to collector 230 of Q7 through a capacitor C2. Emitters of transistor Q5 and Q6 are coupled to ground. Collector 218 of transistor Q5 also is coupled to the emitter 152 of Q3 corresponding to the output 160 that provides $V_{OUT-}$. The capacitor C2 thus operates as pulse generator by providing a transient power pulse to modify the current I2 associated with the current source 154 in accordance with an aspect of the present invention.

The other current source 158 is similarly configured. Briefly stated, a current source 220 is coupled between Vcc and the current source 158, namely to collector 224 of transistor Q8 and to bases 226 and 228 of transistors Q7 and Q8. A capacitor C3 also is coupled to the bases 226 and 228 and couples the bases capacitively with the collector 218 of Q5. Emitters of transistors Q7 and Q8 are coupled to ground. Collector 230 of transistor Q7 is coupled to $V_{OUT+}$. Thus, the capacitor C3 operates as a pulse generator providing a transient power pulse to modify the current I1 associated with the current source 158 according to an aspect of the present invention.

Recalling that $V_{OUT+}$ and $V_{OUT-}$ transition in opposite directions (e.g. they are component signals of a differential signal), when $V_{OUT-}$ makes a transition from a high state ("H"), to a low state ("L"), capacitor C3 passes a transient voltage spike that momentarily reduces the voltage at the base of transistors Q7 and Q8. The momentary reduction in voltage to the base of transistor Q7 results in a corresponding reduction in current I1 which, in turn, reduces the rise time associated with the transition at $V_{OUT+}$ from L to H.

At substantially the same time, capacitor C2 operates in a corresponding manner. That is, when $V_{OUT+}$ makes a transition from L to H, capacitor C2 supplies a transient voltage spike that momentarily increases the voltage at the base of transistors Q5 and Q6. The momentary increase in voltage to the base of transistor Q5 results in a corresponding increase in current I2, which reduces the fall time associated with the transition at $V_{OUT-}$ from H to L.

Transitions in the opposite directions at $V_{OUT-}$ and $V_{OUT+}$ are similarly impacted. In either set of transitions, capacitors C3 and C2 operate to provide short energy pulses which modify currents I1 and I2 respectively. The adjustments in currents I1 and I2, in turn, effect desired improvement in rise times and fall times associated with the transitions at Q3 and Q4. These short current pulses serve to provide the necessary finction to aid in voltage transitions in either direction, (low to high or vice versa) and thereby reduce the associated rise and fall times at $V_{OUT+}$ and $V_{OUT-}$.

Figure 3A:
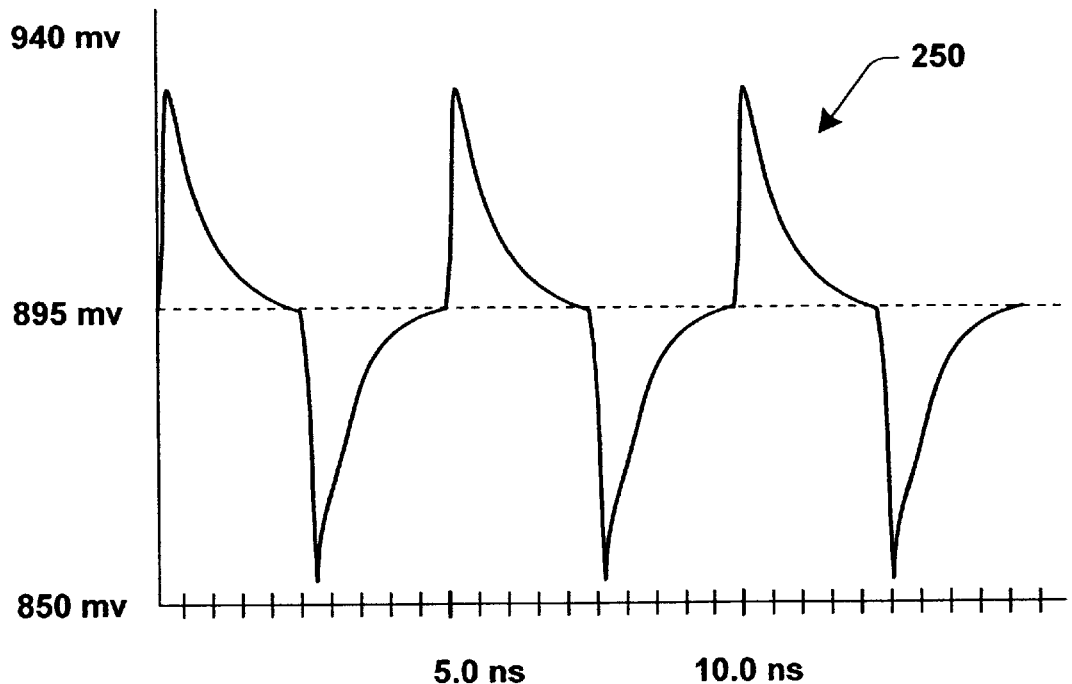
FIGS. 3A and 3B are graphs depicting a transient response of a control voltage signal generated in accordance with an aspect of the present invention.
Figure 3B:
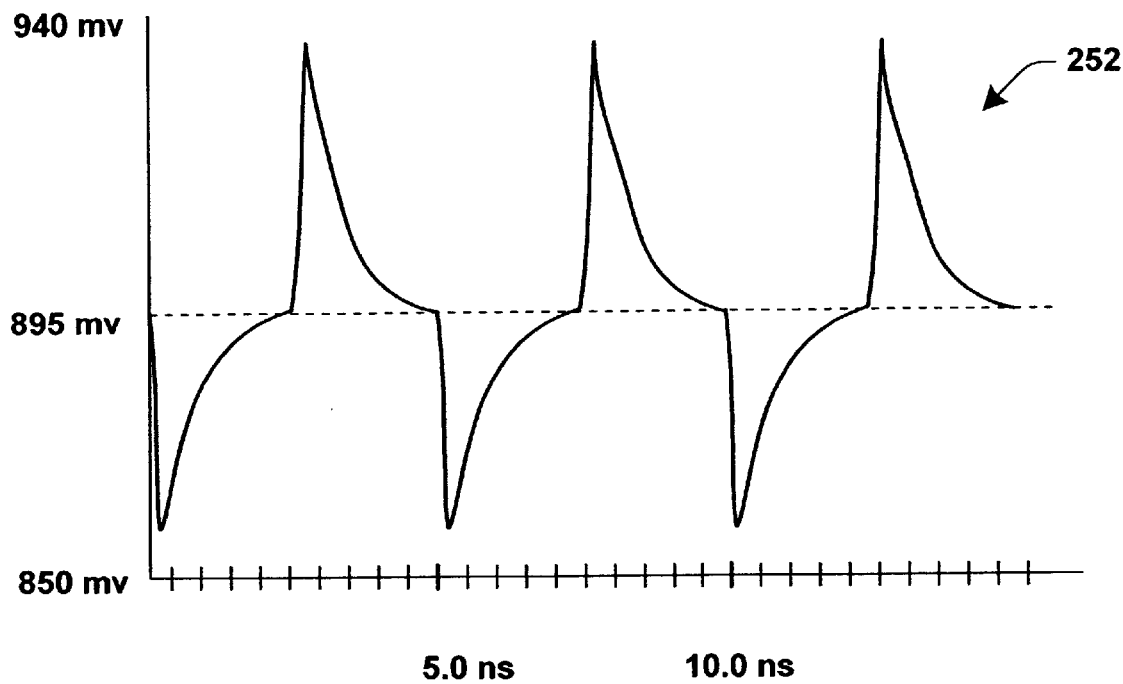

FIGS. 3A and 3B are graphs of the transient voltage responses through capacitors C3 and C2, indicated at 250 and 252, in response to transitions at $V_{OUT-}$ and $V_{OUT+}$ respectively. For example, a negative transition (H to L) at $V_{OUT-}$ results in a voltage spike which reduces the voltage at 252 at capacitor C3 for a transient period of time, such as illustrated in FIG. 3B by the plot of the voltage at C3 versus time. At about the same time, a positive transition L to H at $V_{OUT+}$ results in a voltage spike at capacitor C2, which increases the voltage for a transient period of time, indicated at 250 in FIG. 3A.

Figure 4A:
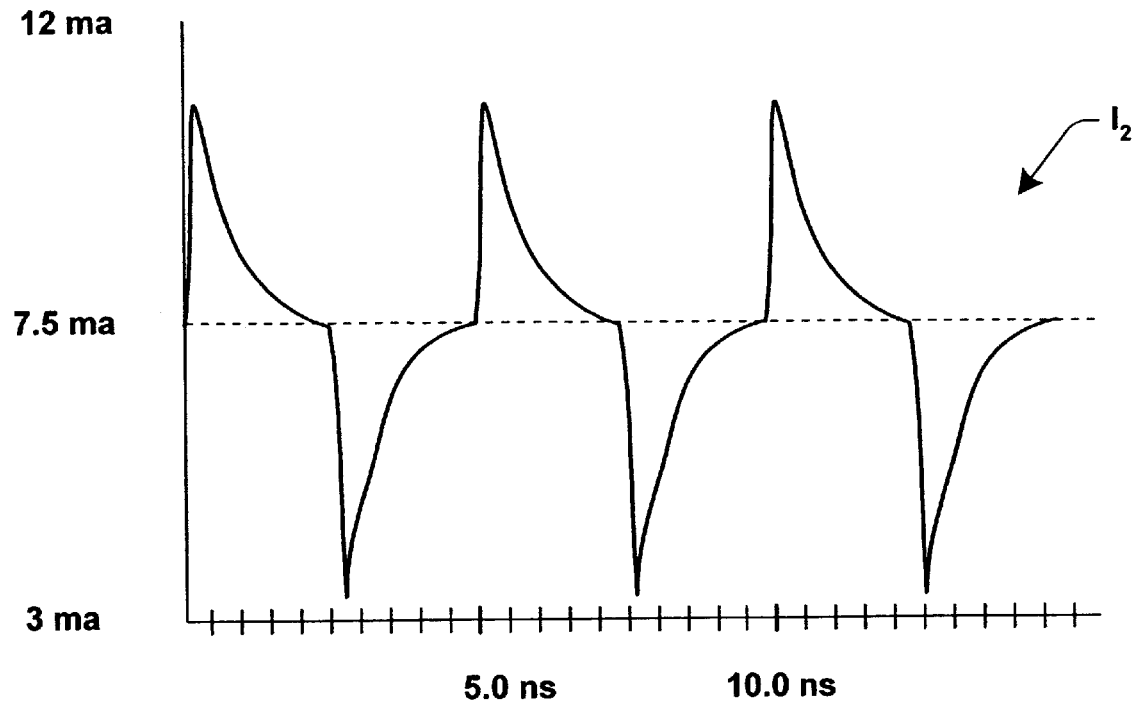
FIGS. 4A and 4B are graphs representing a transient response of current pulses implemented in accordance with an aspect of the present invention.
Figure 4B:
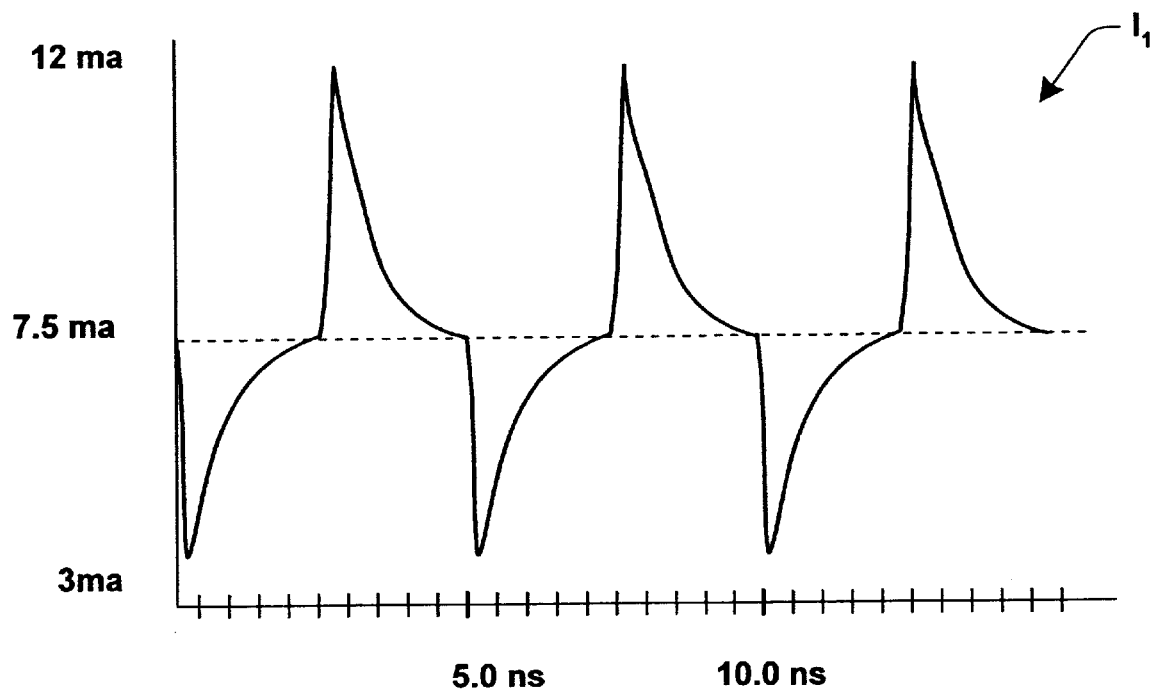

FIGS. 4A and 4B are graphs of the corresponding transient changes in currents I1 and I2 with respect to time, which changes occur in response to the transient voltage spikes across the capacitors C3 and C2 (e.g., as shown in FIGS. 3A and 3B), respectively. As described herein, the voltage spikes at capacitors C2 and C3 cause associated current spikes in respective current sources 154 and 158, which can either be additive or subtractive in nature relative to the steady state current. For example, a transient increase (e.g., pulse) in voltage at C2 (C3) results in a transient increase in current I2 (I1) while a transient decrease in voltage at C2 (C3) results in a transient decrease in current I2 (I1).

Figure 5:
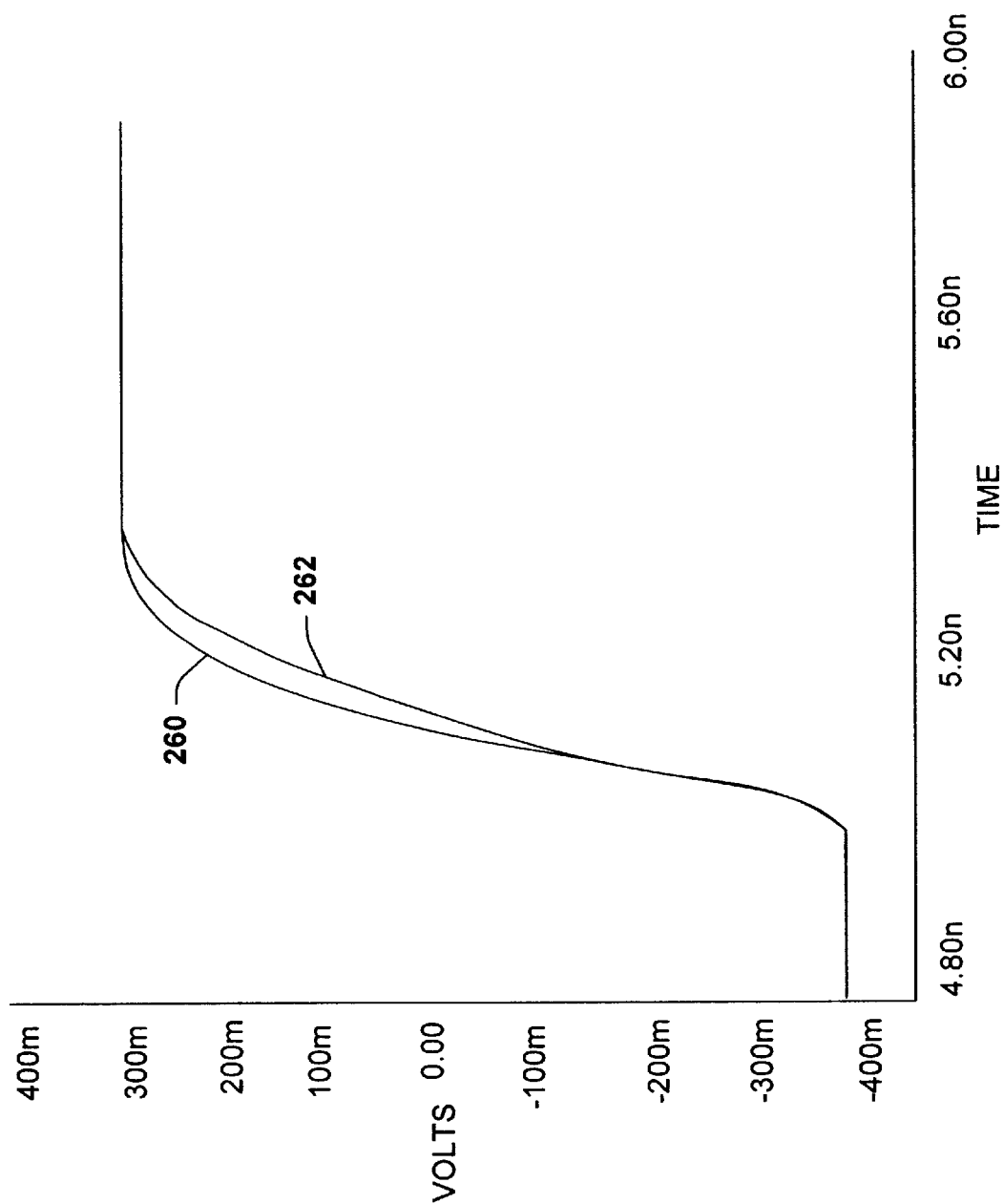
FIG. 5 is a graph illustrating an output of driver in accordance with an aspect of the present invention relative to that of a conventional type of driver.

FIG. 5 is a graph illustrating a low to high transition in an output signal for a conventional driver, indicated at 262, and for a driver implemented in accordance with an aspect of the present invention, indicated at 260. A comparison of the signals 260 and 262 demonstrates a reduction in rise times that can be achieved by using a driver according to an aspect of the present invention, such as that shown in FIG. 2. As illustrated, for example, about a 25% or greater reduction in rise time from about 177 ps (260) to about 130 ps (262) is achievable by employing control circuitry to speed up transitions according to an aspect of the present invention. The reduction in rise times and corresponding reduction in fall times significantly improves the switching speeds of the driver circuit implemented in accordance with the present invention. As a result of faster switching speeds, communications rates between circuit components and ICs can be improved.

Figure 6:
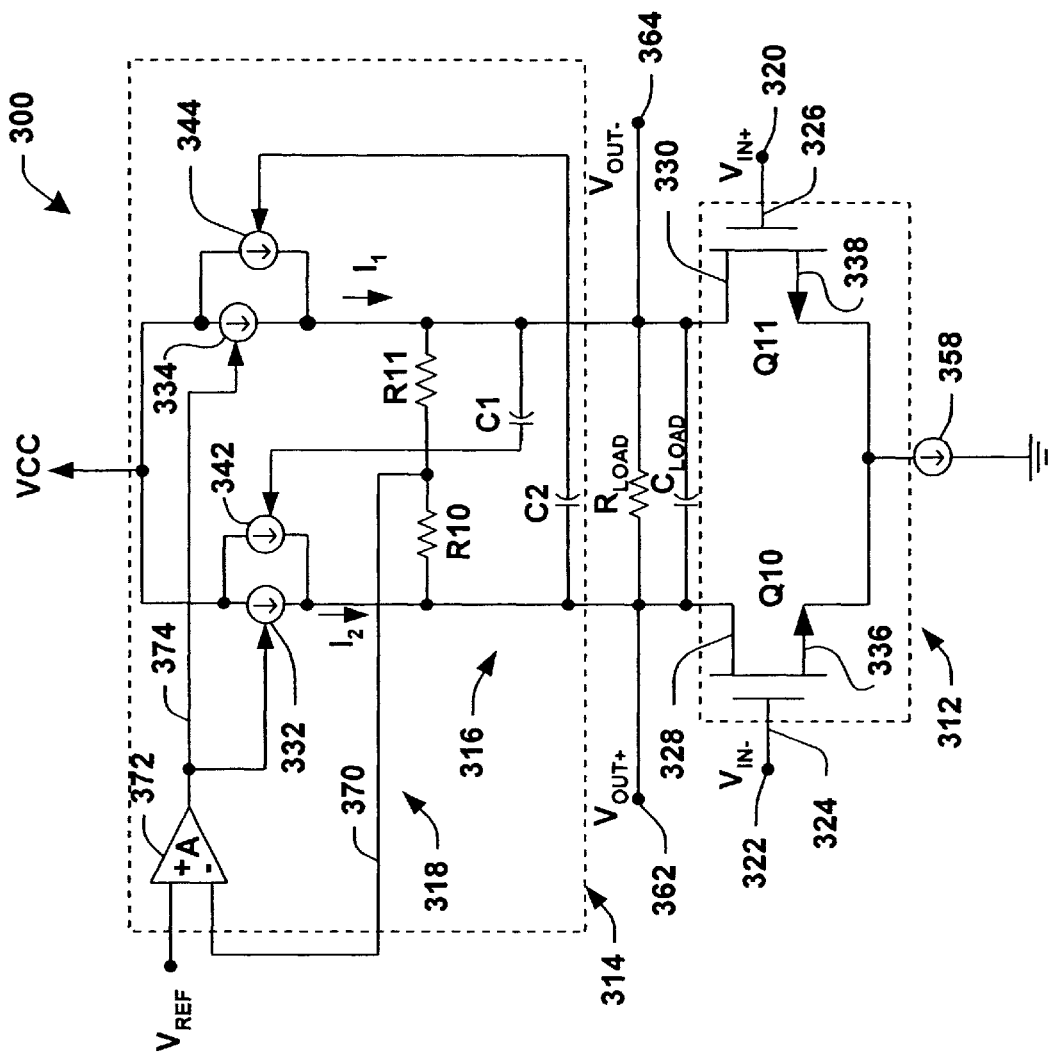
FIG. 6 illustrates an example of another type of driver circuit implemented in accordance with an aspect of the present invention.

FIG. 6 is an electrical schematic diagram of another driver circuit 300 implemented in accordance with an aspect of the present invention. In FIG. 6, driver circuit 300 includes a switching circuit 312 and a control circuit 314. The control circuit 314 includes speed up control circuitry 316 and common mode voltage control circuitry 318.

Switching circuit 312 includes input nodes 320 and 322. In the example of FIG. 6, the driver circuit 300 is depicted as a differential circuit in which a positive component $V_{IN+}$ of the input signal is received at input 320, and a negative component $V_{IN-}$ is received at input 322. Input nodes 320 and 322 are coupled with gates 326 and 324 of respective switching transistors Q11 and Q10. Drains 328 and 330 of transistors Q10 and Q11 are coupled with respective current source 332 and 334, which can include variable current sources. Current sources 332 and 334 are coupled to receive supply voltage $V_{CC}$. Resistors R10 and R11 are coupled in series between drains 328 and 330 of switching transistors Q10 and Q11. Sources 336 and 338 are coupled to ground through a current source 358.

A load resistor $R_{LOAD}$ and a load capacitor $C_{LOAD}$ are coupled in parallel across drains 328 and 330 of switching transistors Q10 and Q11. Output nodes 362 and 364 also are coupled from adjacent opposite ends of load resistor $R_{LOAD}$ to provide, for example, respective components $V_{OUT+}$ and $V_{OUT-}$ of a differential output signal.

Feedback 370 is coupled with a juncture between resistors R10 and R11 to provide a feedback signal to an amplifier 372 of control circuitry 318. Amplifier 372 also receives a reference voltage $V_{REF}$. Amplifier 372 provides an amplified error signal at an output 374. The output signal at 374 represents the difference between a feedback signal at 370 and reference voltage $V_{REF}$. In particular, resistors R10 and R11 are used to sense the common-mode voltages at output nodes 362 and 364, which voltage is supplied to amplifier 372 via feedback 370. Error signal provided at output 374 generated by amplifier 372 control current sources 332 and 334 in order to effect control of the output common mode voltage measured at output nodes 362 and 364. The output 374 thus provides control inputs to set current sources 332 and 334, thereby controlling average drain voltage of switching transistors Q10 and Q11. Such control provides a desired common mode voltage based on the voltage at the juncture between R10 and R11.

Switching transistors Q10 and Q11 switch on or off alternately based on the respective differential input signals provided at 322 and 320. The operation of transistors Q10 and Q11 in this manner provides for alternating current flow paths through the driver 300, which generate the differential voltage at outputs 362 and 364.

As mentioned above, driver 300 includes speed up control circuitry 316 that is operative to facilitate transitions in the output signals provided at 362 and 364 in accordance with an aspect of the present invention. In particular, the speed up circuitry 316 is coupled to control associated current sources 342 and 344, which are depicted as being coupled in parallel with respective current sources 332 and 334. The output of current sources 332 and 342 combine to form current I2 and the output of current sources 334 and 344 combine to from current I1.

In accordance with an aspect of the present invention, the speed up control circuitry 316 includes capacitors C1 and C2, which operate as AC coupling devices. C1 is coupled between output 364 and current source 342. C2 is coupled between output 362 and current source 344. Capacitors C1 and C2 thus control current sources 342 and 344 based on the voltages at 364 and 362, respectively. Recalling that $V_{OUT+}$ and $V_{OUT-}$ transition in opposite directions, for example, when $V_{OUT-}$ makes a transition from a H to L state, capacitor C1 will pass a negative transient voltage spike (e.g., a momentarily reduction in voltage) provided to a control input of current source 342. The momentary reduction in voltage at the control input of current source 342 results in a corresponding momentary increase in current I2, which reduces the rise time associated with the transition at $V_{OUT+}$ from L to H.

At the same time, capacitor C2 operates in a similar manner. That is, when $V_{OUT+}$ makes a transition from a L to H state, capacitor C2 will pass a positive transient voltage at the control input of variable current source 344. The momentary increase in voltage at the control input of 344 results in a corresponding momentary decrease in current I1 which will reduce the fall time associated with the transition at $V_{OUT-}$ from H to L. Thus, C1 and C2 operate as energy sources that provide voltage pulses to facilitate transitions at opposite outputs of the driver 300 from which they are coupled.

Transitions in the opposite directions at $V_{OUT-}$ and $V_{OUT+}$ are similarly impacted. In either set of transitions, capacitors C1 and C2 operate to provide short energy impulses to achieve desired improvement in rise times and fall times associated with such transitions. Capacitors C1 and C2 provide transient pulses which cause current sources 344 and 342 to provide corresponding current pulses that modify the currents I2 and I1, respectively. These short current pulses aid in voltage transitions in either direction, (low to high or vice versa), and thereby reduce the associated rise and fall times at $V_{OUT+}$ and $V_{OUT-}$ in accordance with an aspect of the present invention.

Figure 7:
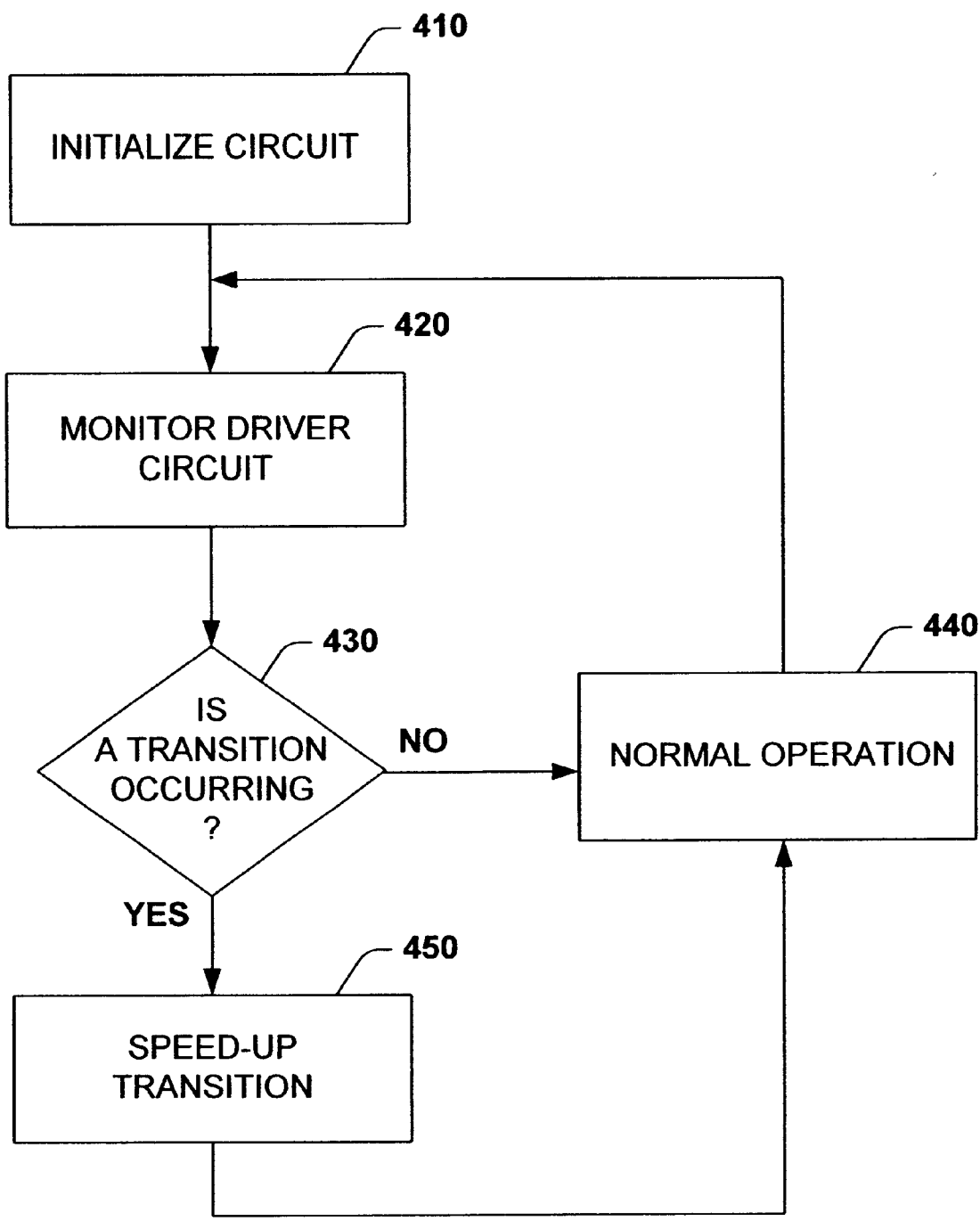
FIG. 7 depicts a flow diagram of a methodology that can be implemented in accordance with an aspect of the present invention.

FIG. 7 is a flow diagram illustrating a methodology for speeding up transitions in one or more outputs of an associated driver circuit according to an aspect of the present invention.

The process begins when the driver circuit is initialized at 410. Initialization, for example, can occur when the system employing the driver is turned on, has the power cycled, or is reset. Once operating, at 420, a signal voltage within the driver circuit is monitored, such as by monitoring a voltage signal associated with an output of the driver. The signal voltage may be monitored at an output of the driver circuit or, alternatively, at an internal location of the circuit, such as associated with an input stage, an output stage or an intermediate location of the circuit.

At 430, a determination is made as to whether a transition is occurring. The transition can correspond to a transition associated with one or more outputs of the driver circuit. For example, the transition can correspond to a H to L transition or a L to H transition at a driver output. Alternatively, the transition(s) could be detected at other locations of the driver circuit. If a transition is not occurring, the process continues to 440 where normal operation can continue. During normal operation, the output (or outputs) is maintained at a desired level, such as high or low. This is to be contrasted with the occurrence of transitions, although it is to be understood that transitions can be considered part of the normal operation of such circuitry. From 440 the methodology proceeds to 420, where the signal voltage continues to be monitored.

Continuing from 430, if a transition is detected, then the process proceeds to 450 wherein a speed-up is implemented relative to the transition. For example, the transition can be expedited by generating a pulse in response to the occurrence of the transition, such as a transient current or voltage pulse. By way of illustration, one or more capacitors pass a transient voltage response to cause a transient current pulse to be provided in response to the transition. The current pulse, in turn, is applied relative to associated circuitry to "speed-up" the transition at the output of the driver. For example, in a driver that includes a differential output, a capacitor can be associated with each output to generate corresponding control signals to implement desired pulses that either source or sink current to implement desired speed-up of the transition. The "speed-up" thus is manifested as a shorter rise time and fall time associated with transitions at the output node. From 450 the methodology proceeds to 440, in which normal operation of the driver can continue.

What has been described above includes examples depicting how the present invention might be implemented. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A speed up system for a driver, comprising:
a detector that detects a detector signal electrically associated with changes in an output signal provided by the driver; and
a control system that provides a control signal to the driver in response to the detector signal indicating an occurrence of a transition associated with the output signal, such that the transition is facilitated.

2. The system of claim 1, the detector signal comprises the output signal of the driver.

3. The system of claim 1, the detector signal comprises an input signal provided to an output stage of the driver.

4. The system of claim 1, the control signal adjusting electrical current in an output stage of the driver to speed up the transition.

5. The system of claim 4, at least one of the detector and control system further comprises a capacitor electrically coupled with an output of the driver to provide a pulse in response to the transition associated with the output signal to adjust the electrical current in the output stage of the driver.

6. The system of claim 4, the output stage of the driver further comprising differential outputs that provides the output signal as a differential signal having two components, the capacitor further comprising first and second capacitors, each of the first and second capacitors being coupled to a respective one of the differential outputs and operative to provide a pulse in response to a transition associated with the respective component of the differential signal to speed up the transition at the other differential output of the driver.

7. The system of claim 6, further comprising a current source associated with each differential output of the driver, each of the current sources adjusting electrical current associated with a respective differential output of the driver based on the pulse from a respective one of the first and second capacitors associated with the other differential output of the driver.

8. The system of claim 7, each of the first and second capacitors being coupled between the respective one of the differential outputs and the current source associated with the other differential output, such that the pulses from each of the first and second capacitors modify electrical current in the driver to speed up transitions at the other differential outputs of the driver.

9. A driver comprising:
an input stage operative to receive at least one input signal;
an output stage that provides at least one output signal based on the at least one input signal; and
a pulse generator electrically associated with the output stage that generates an electrical energy pulse associated with an occurrence of a transition in the at least one output signal of the driver to facilitate the occurrence of the transition.

10. The driver of claim 9, the pulse generator further comprising a capacitor electrically coupled with the output stage to provide the pulse based on the occurrence of the transition.

11. The driver of claim 10, further comprising a current source operative to provide electrical current in the output stage, the capacitor being coupled between the current source and an output of the output stage at which the at least one output signal is provided so as to provide the pulse to the current source to modify the current based on the pulse.

12. The driver of claim 11, the output stage of the driver further comprising differential outputs that provides the output signal as a differential signal relative to a common mode voltage based on the input signal.

13. The driver of claim 12, the capacitor further comprising first and second capacitors, each of the first and second capacitors being coupled to an associated one of the differential outputs of the output stage and operative to provide a respective pulse in response to a transition in the output signal of the associated differential output to speed up a transition in the output signal of the other differential output of the driver.

14. The driver of claim 13, the current source further comprising a current source associated with each differential output of the driver, each of the current sources adjusting electrical current associated with a respective differential output of the driver according to the pulse from a respective one of the first and second capacitors associated with the other differential output of the driver.

15. A differential driver system comprising:
means for receiving an input signal;
means for providing an output signal based on the input signal, the output signal transitioning between first and second conditions;
means for speeding up transitions in the output signal; and
the means for providing an output signal further comprising means for providing a differential output signal at respective outputs, the means for speeding up transitions further comprising means for speeding up transitions at the respective outputs based on transitions occurring at other of the respective outputs.

16. A method for reducing transition time of an output signal of a driver, the method comprising:
monitoring a driver signal associated with the output signal of the driver; and
in response to the occurrence of a transition of the driver signal, providing a pulse to speed up a transition in the output signal of the driver.

17. The method of claim 16, the driver signal is the output signal.

18. The method of claim 16, the driver signal comprises a signal internal to the driver based on which the driver provides the output signal.

19. The method of claim 16, the driver comprising a differential driver providing first and second associated signals that define a differential output signal, the method further comprising providing first and second pulses based on transitions occurring at the respective first and second associated signals, the first pulse speeding up the transition in the second associated signal, and the second pulse speeding up the transition in the first associated signal.

20. The method of claim 16, the pulse being generated by an energy storage device coupled to an output of the driver at which the output signal is provided.

21. The method of claim 20, the energy storage device comprising a capacitor.

22. The method of claim 20, further comprising a current source electrically associated with the output, the current source adjusting electrical current in the driver in response to the pulse to speed up the transition in the output signal.

* * * * *